United States Patent
Chien

(10) Patent No.: US 11,287,186 B2
(45) Date of Patent: Mar. 29, 2022

(54) DRYING DEVICE FOR DISPLAY PANEL

(71) Applicants: HKC Corporation Limited, Guangdong (CN); Chongqing HKC Optoelectronics Technology Co., Ltd., Chongqing (CN)

(72) Inventor: Chung-Kuang Chien, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 199 days.

(21) Appl. No.: 16/614,643

(22) PCT Filed: Jul. 28, 2017

(86) PCT No.: PCT/CN2017/094864
§ 371 (c)(1),
(2) Date: Nov. 18, 2019

(87) PCT Pub. No.: WO2018/209815
PCT Pub. Date: Nov. 22, 2018

(65) Prior Publication Data
US 2020/0096257 A1     Mar. 26, 2020

(30) Foreign Application Priority Data
May 19, 2017   (CN) .......................... 201710358759.0

(51) Int. Cl.
*F26B 21/06*     (2006.01)
*F26B 15/12*     (2006.01)
(Continued)

(52) U.S. Cl.
CPC ............ *F26B 21/06* (2013.01); *F26B 15/122* (2013.01); *F26B 21/003* (2013.01);
(Continued)

(58) Field of Classification Search
CPC ...... F26B 21/06; F26B 15/122; F26B 21/004; F26B 21/12; F26B 23/06; F26B 25/004;
(Continued)

(56) References Cited

U.S. PATENT DOCUMENTS 6,021,790 A * 2/2000 Yoshitani .......... H01L 21/67706
134/62
6,073,369 A * 6/2000 Yasuyuki .............. F26B 21/004
34/651
(Continued)

FOREIGN PATENT DOCUMENTS

CN         2868930 Y     2/2007
CN     101639316 A     2/2010
(Continued)

*Primary Examiner* — Jessica Yuen
(74) *Attorney, Agent, or Firm* — Muncy, Geissler, Olds & Lowe, PC

(57) ABSTRACT

A drying device is configured with a sensor corresponding to an air knife-nozzle, and a control switch which suspends an operation of the device when the air knife-nozzle is detected as working abnormally, thereby preventing abnormal products from being produced due to the failure of finding an abnormal condition of the air knife-nozzle in time, ensuring the normal process of the product, and avoiding the nonessential economic loss.

10 Claims, 4 Drawing Sheets

(51) Int. Cl.
  *F26B 21/00* (2006.01)
  *F26B 21/12* (2006.01)
  *F26B 23/06* (2006.01)
  *F26B 25/00* (2006.01)
  *G02F 1/13* (2006.01)
  *H01L 21/67* (2006.01)

(52) U.S. Cl.
  CPC ............ *F26B 21/004* (2013.01); *F26B 21/12* (2013.01); *F26B 23/06* (2013.01); *F26B 25/004* (2013.01); *G02F 1/1303* (2013.01); *H01L 21/67034* (2013.01)

(58) Field of Classification Search
  CPC ............. F26B 21/003; H01L 21/67034; H01L 21/67288; H01L 21/6776; G02F 1/1303
  See application file for complete search history.

(56) References Cited

U.S. PATENT DOCUMENTS

2011/0306160 A1\* 12/2011 Parks ................. H01L 21/2254
  438/61
2018/0073805 A1\* 3/2018 Hoffman, Jr ............ F26B 21/10

FOREIGN PATENT DOCUMENTS

| | | | | |
|---|---|---|---|---|
| CN | 102023497 A | 4/2011 | | |
| CN | 104329926 A | 2/2015 | | |
| CN | 105605909 A | 5/2016 | | |
| CN | 205488061 U | 8/2016 | | |
| CN | 205518751 U | 8/2016 | | |
| CN | 205619748 U | 10/2016 | | |
| CN | 205708444 U | 11/2016 | | |
| CN | 206039080 U | 3/2017 | | |
| JP | 10180205 A | \* | 7/1998 | ........ H01L 21/6708 |
| JP | 2004125342 A | | 4/2004 | |
| WO | WO-2014026371 A | \* | 2/2014 | ........ C03C 23/0075 |
| WO | WO-2019168822 A1 | \* | 9/2019 | ............ F26B 21/004 |

\* cited by examiner

DRYING DEVICE FOR DISPLAY PANEL

BACKGROUND

Technical Field

This disclosure relates to an electronic technical field, and more particularly to a drying device for a display panel.

Related Art

An air knife drying device has been widely applied to a drying process of a thin film transistor liquid crystal display (TFT-LCD). In the TFT process, an air knife drying device is used in the developing section, the wet etching section and the photoresist removing section to blow away the remaining treatment liquid, and to keep the glass surface dry. Usually, the air knife device will use a nozzle mechanism to perform a wide range of glass drying process, and some of the nozzle mechanisms may be caused by the insufficient wind power or foreign objects to have the air nozzle congestion due to the long term of use. So, some areas of the glass cannot be blown and dried to cause the remained treatment liquid and the product reliability problems. Human eyes are usually used to determine and monitor whether the nozzle mechanism of the air knife works normally during the maintenance of the apparatus. So, whether the nozzle mechanism works normally cannot be obtained in time. When the nozzle is found to be abnormal, a lot of abnormal products have been produced.

SUMMARY

This disclosure provides a drying device for a display panel, which can immediately monitor whether a drying work is normal to avoid the production of abnormally dried products.

In one aspect, this disclosure provides a drying device for a display panel comprising:

a frame comprising a body for mounting the drying device and a stand supporting the body;

an air knife assembly comprising an air knife-nozzle, a gas supply device connected to the air knife-nozzle through a pipeline, and a regulating device controlling a wind strength of the air knife-nozzle, wherein the air knife-nozzle comprises a first air knife-nozzle and a second air knife-nozzle respectively blowing two surfaces of a display panel;

a transfer component comprising a transport platform for transporting the display panel to be cleaned by the air knife-nozzle;

an air cover disposed on two sides of the transport platform to prevent a liquid, blown up by the air knife-nozzle, from splashing;

a detection component comprising a sensor disposed in correspondence with the air knife-nozzle to detect whether the air knife-nozzle works normally; and a control switch electrically connected to the sensor and controlling the drying device to suspend when the sensor detects that the air knife-nozzle works abnormally.

In one aspect, the disclosure also provides a drying device for a display panel comprising:

a frame comprising a body for mounting of the drying device and a stand supporting the body;

an air knife assembly comprising an air knife-nozzle, a gas supply device connected to the air knife-nozzle through a pipeline, and a regulating device controlling a wind strength of the air knife-nozzle, wherein the air knife-nozzle comprises a first air knife-nozzle and a second air knife-nozzle respectively blowing two surfaces of a display panel;

a transfer component comprising a transport platform transporting the display panel to be cleaned by the air knife-nozzle;

an air cover disposed on two sides of the transport platform to prevent a liquid, blown up by the air knife-nozzle, from splashing, wherein the air cover is made of a transparent material;

a detection component comprising a sensor disposed in correspondence with the air knife-nozzle to detect whether the air knife-nozzle works normally; and a control switch electrically connected to the sensor and controlling the drying device to suspend when the sensor detects that the air knife-nozzle works abnormally.

In one aspect, this disclosure provides an air knife assembly, which is applied to the drying device, and comprises:

an air knife-nozzle:

a gas supply device connected to the air knife-nozzle through a pipeline; and a regulating device controlling a wind strength of the air knife-nozzle;

the air knife-nozzle comprises a first air knife-nozzle and a second air knife-nozzle respectively blowing two surfaces of the display panel.

The drying device for a display panel of this disclosure is provided with: a sensor, which corresponds to the air knife-nozzle and detects whether the air knife-nozzle works normally; and a control switch, which receives a signal from the sensor when the air knife-nozzle is detected as working abnormally, and suspends an operation of the device, thereby preventing abnormal products from being produced due to the failure of finding an abnormal condition of the air knife-nozzle in time, ensuring the normal process of the product, and avoiding the nonessential economic loss.

BRIEF DESCRIPTION OF THE DRAWINGS

The embodiments will become more fully understood from the detailed description and accompanying drawings, which are given for illustration only, and thus are not limitative of the present invention, and wherein.

DETAILED DESCRIPTION OF THE INVENTION

In order to provide the better understanding of this disclosure to those skilled in the art, the technical solution in the embodiments of this disclosure will be clearly described with reference to the accompanying drawings in the embodiments of this disclosure. Obviously, the described embodiment is the embodiment one portion of the module of this disclosure, rather than the embodiment of the entire module. All other embodiments obtained by those skilled in the art based on the embodiments of this disclosure without making creative work are deemed as falling within the scope of this application.

The specification and claims of this disclosure, and the terms "comprising" in the above-mentioned drawings and any variations thereof intend to cover the non-exclusive inclusion. For example, a process, method, system, product or device comprising a series of steps or units is not limited to the listed steps or units, but may further optionally comprise steps or units not listed, or alternatively comprise other steps or units inherent to these processes, methods, products or equipment. In addition, the terms "first," "second" and "third" are used to distinguish between different objects and not for describing a particular order.

To be noted, the terms disclosed in this disclosure are for describing some specific embodiments and are not to limit this disclosure. Throughout the specification and claims, the terms "a" and "one" can be realized as "one or more", unless the context clearly dictates otherwise elsewhere.

Figure 1:
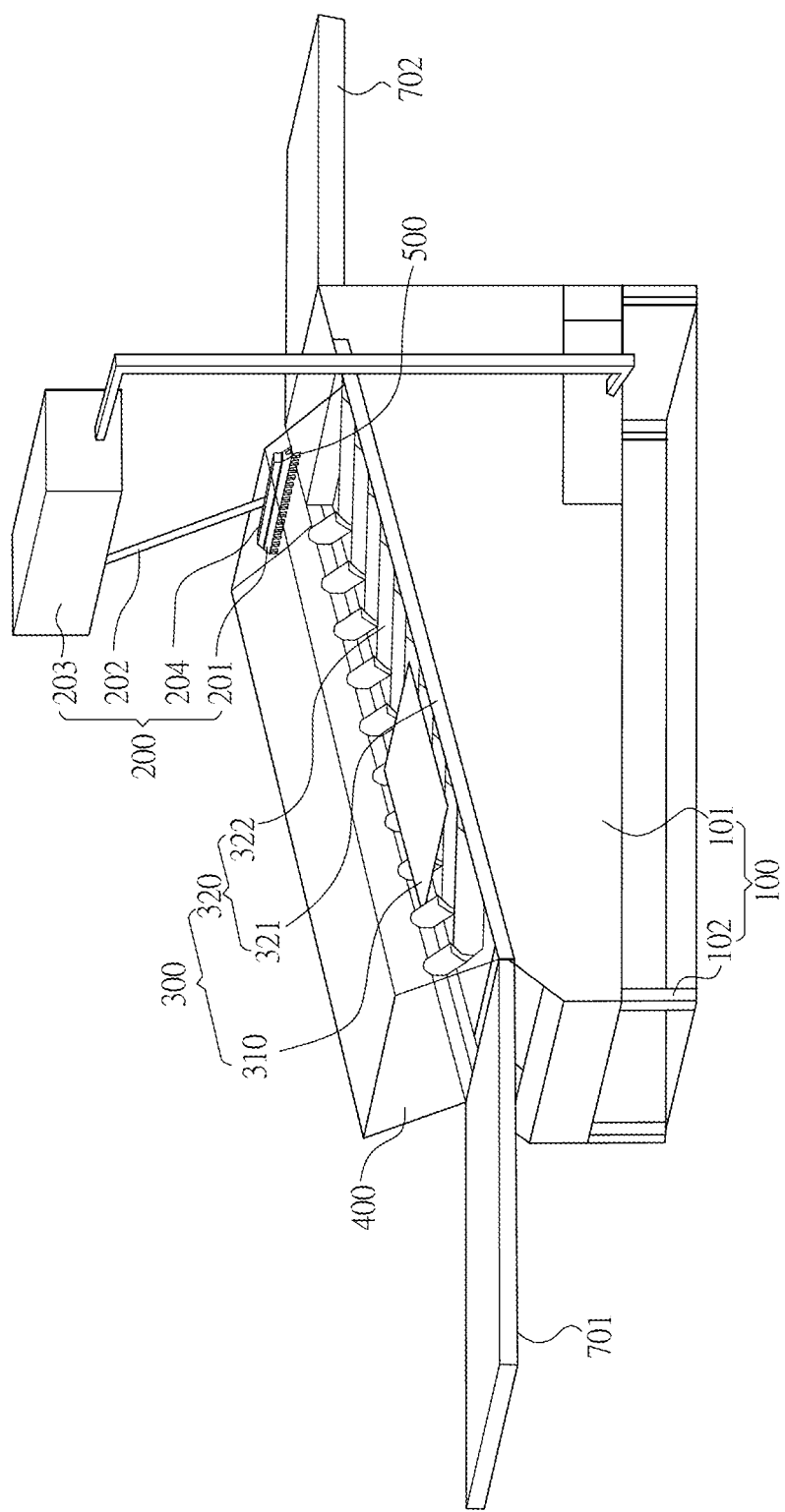
FIG. 1 is a schematic structure view showing a drying device for a display panel provided by an embodiment of this disclosure.
Figure 4:
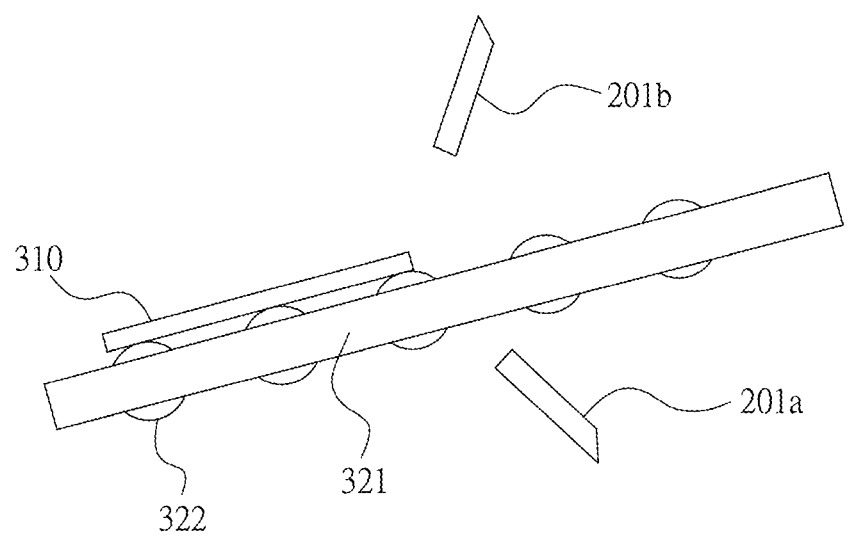
FIG. 4 is a partial side view showing a drying device for a display panel provided by an embodiment of this disclosure.

Referring to FIGS. 1 and 4, a drying device for a display panel provided by this disclosure comprises a frame 100 comprising a body 101 for mounting of the drying device and a stand 102 for supporting the body 101; an air knife assembly 200 comprising an air knife-nozzle 201, a gas supply device 203 connected to the air knife-nozzle 201 through a pipeline 202 and a regulating device 204 controlling a wind strength of the air knife-nozzle 201, wherein the air knife-nozzle 201 comprises a first air knife-nozzle 201a and a second air knife-nozzle 201b respectively blowing two surfaces of a display panel 310; an transfer component 300 comprises a transport platform 320 for transporting the display panel 310 to be dried by the air knife-nozzle 201; an air cover 400 is disposed on two sides of the transport platform 320 to prevent the liquid, blown up by the air knife-nozzle 201, from splashing; a detection component comprising a sensor 500 disposed in correspondence with the air knife-nozzle 201 to detect whether the air knife-nozzle 201 works normally; and a control switch 800 electrically connected to the sensor 500 and controlling the overall drying device to suspend the operation when the sensor 500 detects that the air knife-nozzle 201 works abnormally.

Specifically, the display panel 310 is transported, by a front transport platform 701, into the drying device provided by the embodiment of this disclosure for drying, and is transported to a next process by a post transport platform 702 after the drying is completed. The display panel 310 is transported, by the front transport platform 701, onto the transport platform 320 in the drying device provided by the embodiment of this disclosure, and the transport platform 320 drives the display panel 310 into the drying range of the air knife-nozzle 201 for drying. Before the display panel 310 is transported to the drying position, the air knife-nozzle 201 is opened in advance, and the sensor 500 detects whether the air knife-nozzle 201 works normally. If the detection is normal, then the transporting of the display panel 310 starts and the drying operation is performed. If the detection is abnormal, then the control switch 800 controls the overall drying device to suspend the operation, and reminds the operator to perform the detecting and troubleshooting. The air knife-nozzle 201 comprises a first air knife-nozzle 201a and a second air knife-nozzle 201b respectively blowing two surfaces of a display panel 310. When whether the air knife-nozzle 201 works normally is detected, the measure for detecting one at a time is adopted in order to prevent the mutual interference between the first air knife-nozzle 201a and the second air knife-nozzle 201b. When the first air knife-nozzle 201a is detected, the second air knife-nozzle 201b is closed. When the second air knife-nozzle 201b is detected, the first air knife-nozzle 201a is closed. After the detection is completed and no problem is found, the first air knife-nozzle 201a and the second air knife-nozzle 201b are concurrently opened for the drying operations.

In one specific embodiment, the position of the air knife-nozzle 201 may be not restricted, and may be any position satisfying the drying of the display panel 310. For example, the first air knife-nozzle 201a and the second air knife-nozzle 201b may be disposed at top and bottom positions, and may also be disposed on two sides of the display panel 310.

By disposing the sensor 500 in correspondence with the air knife-nozzle 201 to detect whether the air knife-nozzle 201 works normally, and the control switch 800 which receives a signal from the sensor 500 to suspend the operation of the device upon detecting that the air knife-nozzle 201 works abnormally, it is thus possible to prevent the abnormal products from being produced due to the failure of finding out the abnormal condition of the air knife-nozzle 201 in time, thereby ensuring the normal process of the product, and avoiding the nonessential economic loss.

Specifically, if the sensor 500 detects that the air knife-nozzle 201 works normally, then the transport platform 320 drives the display panel 310 to the drying range of the air knife-nozzle 201 for drying. The air cover 400 for preventing the liquid, blown up by the air knife-nozzle 201, from splashing is disposed on two sides of the transport platform.

Specifically, the air knife-nozzle 201 may have a flat strip shaped structure, and the outlet thereof for spraying may be disposed on an end portion of the air knife-nozzle 201 and are aligned with flat strip shaped openings of the transport platform 320, or disposed on the end portion of the air knife-nozzle 201 and in the form of fine through holes arranged in columns and rows in an equally spaced manner. For example, a spacing distance of each fine through hole is set to be 3 to 4 mm, and the specific diameter of the fine through hole may be adjusted according to the actual requirement.

Specifically, the air cover 400 may be made of a transparent material, such as glass, transparent plastic or the like. The air cover 400 may be disposed in a manner close to the transport platform 320 along the outer side of the transport platform 320. Using the air cover 400 made of the transparent material allows the intuitive convenient observation on the drying operation of the display panel 310 thereinside, and facilitates the worker in controlling the drying condition of the display panel. The air cover 400 may further be formed with an operation window that can be pushed and pulled, so that the worker can open the window to perform the operation when the worker needs to perform the operation in the air cover 400.

Furthermore, the sensor 500 detecting whether the air knife-nozzle 201 works normally is a swing sensor, and the swing sensor 500 is disposed at an outlet of the air knife-nozzle 201.

Specifically, the sensor 500 may be a swing sensor, and the monitoring position of the swing sensor is disposed at an outlet of the air knife-nozzle 201 to sense whether the outlet of the air knife-nozzle 201 can normally blow air. Using the swing sensor can monitor the working condition of the air knife-nozzle 201, and can immediately respond with the responding action when the air knife-nozzle 201 becomes abnormal. For example, a signal is transmitted to the control switch 800 in this embodiment, so that the control switch 800 suspends the operation of the overall device, thereby avoiding the nonessential loss.

Figure 2:
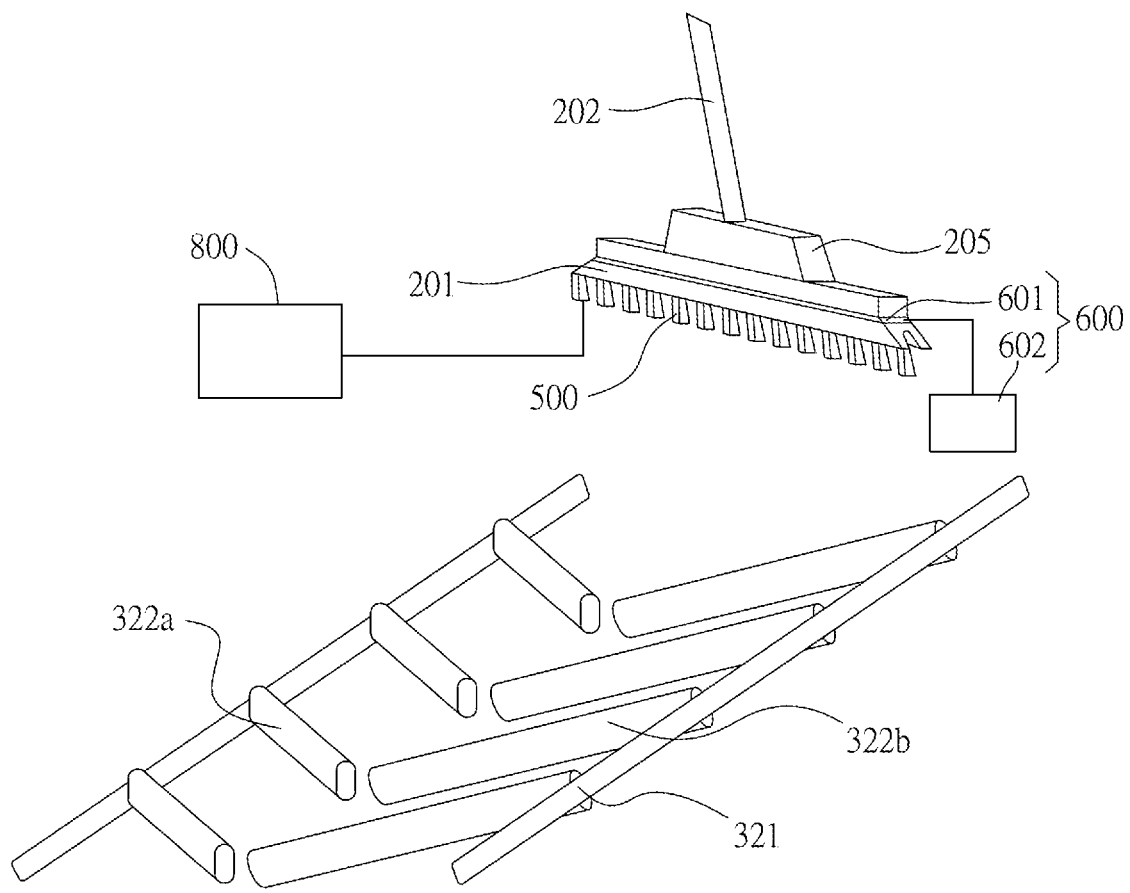
FIG. 2 is an enlarged partial view showing a drying device for a display panel provided by an embodiment of this disclosure.

Referring further to FIGS. 1 and 2, the transport platform 320 comprises roller stands 321 and conveying rollers 322. The roller stands 321 are disposed in parallel along the conveying direction, and the conveying rollers 322 are parallelly interposed between the roller stands 321.

Furthermore, one side of the roller stand 321 near the air knife-nozzle 201 is tilted up by a predetermined angle, so that the conveyed display panel 310 meets the air knife-nozzle 201 at a predetermined angle in an upwardly tilted manner.

Furthermore, each of the conveying rollers 322 comprises two sub-rollers 322a and 322b. The two sub-rollers 322a and 322b are fixed in a V shape, and an included angle of the V shape is directed to the conveying direction of the display panel 310.

Specifically, the display panel 310 is conveyed onto the transport platform 320, and then driven by the conveying rollers 322 to move forward, wherein one side of the roller stand 321 near the air knife-nozzle 201 is tilted up by a predetermined angle, so that the conveyed display panel 310 meets the water jet nozzle 201 at the predetermined angle in an upwardly tilted manner, to prevent the cleaning fluid, blown up when the display panel 310 is dried by the air knife-nozzle 201, from splashing to the dried portion of the display panel 310, and to make the flowing directions of the blown up cleaning fluid have the consistency. For example, one side of the roller stand 321 near the air knife-nozzle 201 is tilted up by 30°, and the display panel 310 has a 30° inclined surface upon being drying. The blown remaining liquid flows to the surface that has not yet been blown along the surface of the display panel, without flowing up to the dried surface, so that the secondary humid after drying can be avoided. Meanwhile, the two sub-rollers 322a and 322b are used to form a V-shaped structure directed to the conveying direction of the display panel 310, so that the display panel 310 is always kept at the middle position of the transporting path when being transported to prevent the transported display panel 310 from shaking on two sides, or even knocking when being transported to the edge. The V-shaped included angle formed by the two sub-rollers may be configured according to the actual condition. The lengths of the two sub-rollers are the same and symmetrically distributed along the transporting path of the display panel. Thus, the display panel can be finally controlled to locate at the middle position of the conveying roller 322 no matter where the display panel is placed on the conveying roller 322.

Furthermore, a surface of the conveying roller 322 is provided with an anti-slip sleeve.

Specifically, the rinsing liquid is remained on the conveying roller 322 when the to-be-dried display panel 310 is being transported, a certain slip is caused when the display panel 310 is on the surface of the conveying roller 322, and the provision of the anti-slip sleeve enables the display panel 310 to be firmly attached to the conveying roller 322 upon being dried by the wind. The provided anti-slip sleeve may be an entire anti-slip material covering the surface of the conveying roller 322, or an anti-slip ring is fitted with the surface of one portion of the conveying roller 322 as long as the objective of preventing the display panel 310 in the transporting and drying processes from slipping can be achieved.

Further, the air knife assembly 200 further comprises a vibrator 205 for driving the air knife-nozzle 201 to vibrate back and forth horizontally in a direction perpendicular to the conveying direction.

Specifically, the provision of the vibrator 205 for driving the air knife-nozzle 201 to vibrate back and forth horizontally in a direction perpendicular to the conveying direction can make the display panel 310 be dried more thoroughly, and can enhance the drying efficiency.

Furthermore, a jetting direction of the air knife-nozzle 201 is tilted at a predetermined angle in a direction in which the display panel 310 is conveyed.

Specifically, regulating the wind direction of the air knife-nozzle 201 can make the blown up wind strength of the air knife-nozzle 201 slantingly contact the display panel 310, so that the blown up splashing liquid has the consistent flowing directions, and the drying effect can be enhanced at the same time.

In some embodiments, the display panel 310 may be, for example, a twisted nematic liquid crystal display panel, an in-plane switching liquid crystal display panel or a multi-domain vertical alignment liquid crystal display panel, an organic electroluminescent semiconductor display panel (OLED), a quantum dot display panel (QLED), a curved surface display panel or other display panels.

Figure 3:
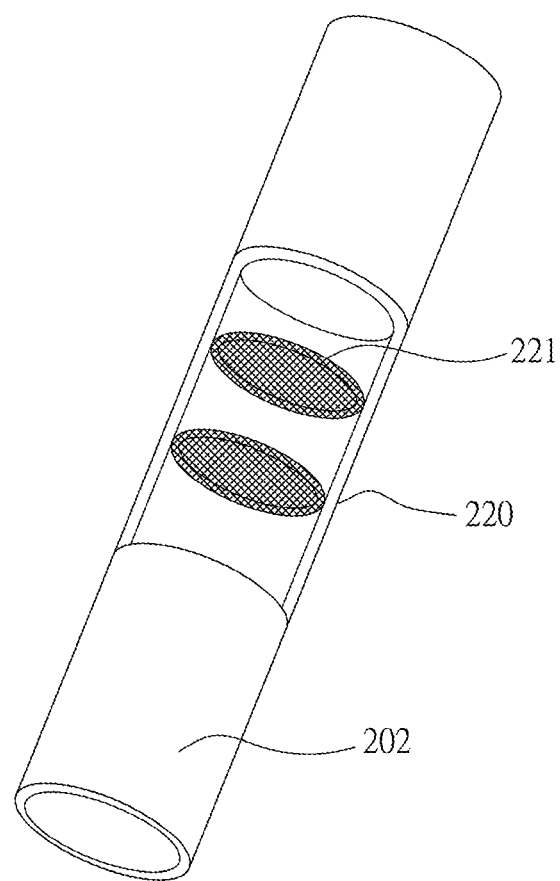
FIG. 3 is another partial schematic view showing a drying device for a display panel provided by an embodiment of this disclosure.

Referring further to FIG. 3, the pipeline 202 between the air knife-nozzle 201 and the gas supply device 203 comprises a detachable filter tube 220, and a filter 221 is disposed inside the filter tube 220.

Specifically, the provision of a section of filter tube 220 on the pipeline 202, and the provision of the filter 221 inside the filter tube 220 can effectively block the impurities inside the gas supply device 203 from flowing to the air knife-nozzle 201 to disable the overall device from operating normally due to the impurities blocking the air knife-nozzle 201. Meanwhile, the filter tube 220 is detachable, and fixed and connected to the pipeline 202 by way of threading, so that the detachment is convenient, and the impurities in the pipeline 202 can be conveniently cleaned.

Referring further to FIG. 2, the drying device further comprises a heating component 600. The heating component 600 comprises a heating fin 601 and a regulator 602. The heating fin 601 is disposed inside the air knife assembly 200, and the regulator 602 is electrically connected to the heating fin 601 and for regulating the heating temperature the heating fin 601.

Specifically, the drying device provided by this disclosure embodiment further comprises the heating component 600. The heating component 600 comprises the heating fin 601 disposed inside the air knife assembly 200, and the heating fin 601 may be disposed inside the air knife-nozzle 201, or inside the pipeline 202, for heating the gas delivered from the gas supply device 203. The heated gas will greatly improve the drying effect and efficiency of the display panel. Meanwhile, the regulator 602 is provided to control the heating fin 601 to heat the gas temperature, so that the regulator 602 controls the heating fin 601 to heat the gas blown out of the air knife-nozzle 201 according to drying temperatures being acceptable by display panels made of different materials, thereby enhancing the drying efficiency.

In the embodiments provided herein, it is to be understood that the disclosure is merely illustrative and may be implemented in other ways.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A drying device for a display panel, comprising:
a frame comprising a body for mounting the drying device and a stand supporting the body;
an air knife assembly comprising an air knife-nozzle, a gas supply device connected to the air knife-nozzle through a pipeline, and a regulating device controlling a wind strength of the air knife-nozzle, wherein the air knife-nozzle comprises a first air knife-nozzle and a second air knife-nozzle respectively blowing two surfaces of a display panel;
a transfer component comprising a transport platform for transporting the display panel to be cleaned by the air knife-nozzle;
an air cover disposed on two sides of the transport platform to prevent a liquid, blown up by the air knife-nozzle, from splashing;
a detection component comprising a sensor disposed in correspondence with the air knife-nozzle to detect whether the air knife-nozzle works normally; and
a control switch electrically connected to the sensor and controlling the drying device to suspend when the sensor detects that the air knife-nozzle works abnormally.

2. The drying device according to claim 1, wherein the sensor detecting whether the air knife-nozzle works normally is a swing sensor, and the swing sensor is disposed at an outlet of the air knife-nozzle.

3. The drying device according to claim 1, wherein the transport platform comprises roller stands and conveying rollers, the roller stands are arranged in parallel along a conveying direction, and the conveying rollers are parallelly interposed between the roller stands.

4. The drying device according to claim 3, wherein one side of the roller stand near the air knife-nozzle is tilted up by a predetermined angle, so that the conveyed display panel meets the air knife-nozzle at a predetermined angle in an upwardly tilted manner.

5. The drying device according to claim 3, wherein each of the conveying rollers comprises two sub-rollers, the two sub-rollers are fixed in a V shape, and an included angle of the V shape is directed to the conveying direction of the display panel.

6. The drying device according to claim 1, wherein a jetting direction of the air knife-nozzle is tilted at a predetermined angle in a direction in which the display panel is conveyed.

7. The drying device according to claim 1, wherein the pipeline between the air knife-nozzle and the gas supply device comprises a detachable filter tube, and a filter is disposed inside the filter tube.

8. The drying device according to claim 1, further comprising:
a heating component comprising a heating fin and a regulator, wherein the heating fin is disposed inside the air knife assembly, and the regulator is electrically connected to the heating fin and regulates a heating temperature of the heating fin.

9. The drying device according to claim 1, wherein the air knife assembly further comprises:
a vibrator driving the air knife-nozzle to vibrate back and forth horizontally in a direction perpendicular to a conveying direction.

10. The drying device according to claim 1, wherein the air cover is made of a transparent material.

* * * * *